(12) United States Patent
Domke et al.

(10) Patent No.: US 8,734,899 B2
(45) Date of Patent: May 27, 2014

(54) MODIFIED PARTICLES AND DISPERSIONS COMPRISING THESE

(75) Inventors: Imme Domke, Mannheim (DE); Andrey Karpov, Mannheim (DE); Hartmut Hibst, Schriesheim (DE); Radoslav Parashkov, XE Voorburg (NL); Ingolf Hennig, Neulussheim (DE); Marcel Kastler, Mainz (DE); Friederike Fleischhaker, Niedernhausen (DE); Lothar Weber, Bielefeld (DE); Peter Eckerle, Weinheim (DE)

(73) Assignee: BASF SE, Ludwigshafen (DE)

( * ) Notice: Subject to any disclaimer, the term of this patent is extended or adjusted under 35 U.S.C. 154(b) by 618 days.

(21) Appl. No.: 13/062,229

(22) PCT Filed: Aug. 28, 2009

(86) PCT No.: PCT/EP2009/061103
§ 371 (c)(1),
(2), (4) Date: Mar. 4, 2011

(87) PCT Pub. No.: WO2010/026102
PCT Pub. Date: Mar. 11, 2010

(65) Prior Publication Data
US 2011/0163278 A1 Jul. 7, 2011

(30) Foreign Application Priority Data
Sep. 4, 2008 (EP) .................................. 08163703

(51) Int. Cl.
*B05D 5/00* (2006.01)
*B05D 7/24* (2006.01)
(52) U.S. Cl.
USPC ........ 427/220; 427/457; 427/485; 427/126.1; 427/126.3; 427/215; 428/357; 428/405; 977/778; 977/786; 977/811; 977/847
(58) Field of Classification Search
USPC .......... 427/457, 485, 126.1, 126.3, 215, 220; 428/357, 405; 977/778, 786, 811, 847
See application file for complete search history.

(56) References Cited

U.S. PATENT DOCUMENTS

| | | | |
|---|---|---|---|
| 2,303,330 A | 12/1942 | Silver et al. | |
| 2003/0161959 A1 | 8/2003 | Kodas et al. | |
| 2005/0234416 A1 | 10/2005 | Kropf et al. | |
| 2007/0104877 A1 | 5/2007 | Kodas et al. | |
| 2007/0104878 A1 | 5/2007 | Kodas et al. | |
| 2008/0303439 A1* | 12/2008 | Kim .............................. | 313/583 |
| 2009/0004098 A1 | 1/2009 | Schmidt et al. | |

FOREIGN PATENT DOCUMENTS

| | | |
|---|---|---|
| DE | 102 57 388 | 6/2004 |
| DE | 10 2004 048 230 | 4/2006 |
| DE | 10 2005 007 374 | 8/2006 |
| DE | 10 2005 047 807 | 12/2006 |
| EP | 1 630 136 | 3/2006 |
| EP | 1 900 426 | 3/2008 |
| WO | 02 49559 | 6/2002 |
| WO | 2006 138071 | 12/2006 |
| WO | 2006 138072 | 12/2006 |

OTHER PUBLICATIONS

U.S. Appl. No. 13/047,156, filed Mar. 14, 2011, Michailovski, et al.
U.S. Appl. No. 13/203,579, filed Aug. 26, 2011, Domke, et al.
U.S. Appl. No. 13/117,799, filed May 27, 2011, Michailovski, et al.
U.S. Appl. No. 13/225,046, filed Sep. 2, 2011, Deuerlein, et al.
U.S. Appl. No. 13/379,247, filed Dec. 19, 2011, Riggs, et al.
International Search Report Issued Jan. 14, 2010 in PCT/EP09/061103 filed Aug. 28, 2009.
U.S. Appl. No. 13/809,496 filed Jan. 10, 2013, Koehler, et al.
U.S. Appl. No. 13/101,372, filed May 5, 2011, Domke, et al.
U.S. Appl. No. 13/139,091, filed Jun. 10, 2011, Domke, et al.

* cited by examiner

*Primary Examiner* — Mark Kopec
*Assistant Examiner* — Haidung Nguyen
(74) *Attorney, Agent, or Firm* — Oblon, Spivak, McClelland, Maier & Neustadt, L.L.P.

(57) ABSTRACT

The present invention relates to particles which have been modified by a modifier and a dispersion medium comprising the modified particles.

The surface-modified metal, metal halide, metal chalcogenide, metal nitride, metal phosphide, metal boride or metal phosphate particles or mixtures thereof have an average particle diameter of from 1 to 500 nm and their surface has been modified by one or more modifiers of the formula (I) (II) and (III)

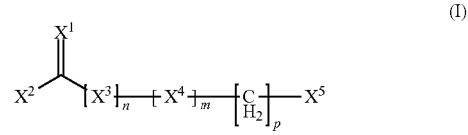

(I)

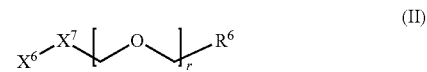

(II)

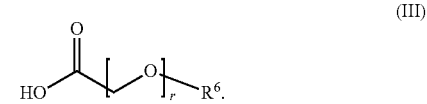

(III)

17 Claims, 4 Drawing Sheets

MODIFIED PARTICLES AND DISPERSIONS COMPRISING THESE

CROSS-REFERENCE TO RELATED APPLICATIONS

This application is a National Stage of PCT/EP2009/061103 filed on Aug. 28, 2009. This application is based upon and claims the benefit of priority to European Application No. 08163703.5 filed on Sep. 4, 2008.

BACKGROUND OF THE INVENTION

The present invention relates to particles which have been modified by a modifier and a dispersion comprising the modified particles.

Zinc oxide is a promising semiconductor in thin film transistors (TFTs) for producing advantageous TFT circuits in large displays or other electronic circuits.

A critical step in the production of these metal oxide semiconductor FETs (MOSFETs) is the deposition of zinc oxide or other semiconductors on the respective substrate.

There is great interest in depositing semiconductors on polymeric or other flexible substrates since these are advantageous not only in terms of their low weight and mechanical stability but can also be processed by significantly more advantageous deposition from dispersions by methods such as spin coating, dip coating or printing techniques. However, polymeric substrates limit the processing window to below 200° C.

A colloidally stable dispersion is important for the deposition in order to make formation of a homogeneous layer of finely divided nanosize particles possible. Additives (modifiers) which effectively prevent agglomeration of the primary particles are required for this purpose. The use of such additives in general has also been known for a long time from other applications.

WO 2006/138071 and WO 2006/138072 each disclose a process for the deposition of a semiconducting zinc oxide layer on a substrate from a colloidal dispersion. The dispersion is preferably applied at room temperature and subsequently baked at temperatures below 300° C. (annealing). The dispersions used are stabilized, but nothing is said about any stabilizers or modifiers.

DE 102 57 388 A1 describes a surface-modified nanoparticulate zinc oxide for use in cosmetic formulations, in which the surface modification comprises coating with an organic acid of the general formula HOOC—$R^1$—$(CH_2)_n$—$R^2$—$CH_3$, where $R^1$=$CH_2$—(O—$CH_2$—$CH_2)_m$; where m=0 to 11, n=0 to 30 and when m=0, n is greater than 11; and $R^2$=$CH_2$, $CHCH_2$, $C(CH_3)_2$, phenylene, O, S. As preferred modifiers, mention is made of lauryl ether-11-polyethyleneglycolic acid, capryl ether-6-polyethyleneglycolic acid, lauryl ether-4-polyethyleneglycolic acid, lauryl ether-6-polyethyleneglycolic acid and/or lauryl ether-8-polyethyleneglycolic acid.

DE 10 2005 007 374 A1 discloses nanoparticles which have been modified by a biodegradable polymer, in particular polyesters, polycyanoacrylates, polyacrylates, polymethacrylates, polyepoxides, polyurethanes and polystyrenes. EP 1630136 A1 discloses titanium dioxide particles which have been modified by a hydrophilic polymer, in particular polycarboxylic acids. The carboxyl group of the modifier is bound via an ester bond to the titanium dioxide. Further modifiers are described in DE 10 2005 047 807 A1.

The modified particles or dispersions used hitherto have the disadvantage that they considerably worsen the performance of semiconductor components in the deposition of conductive, semiconducting or dielectric layers or it is necessary to employ a thermal treatment at temperatures at which the substrates are damaged in order to improve the performance. This is particularly true when using polymer substrates whose thermal stability is generally lower than that of inorganic substrates.

It is therefore an object of the invention to provide particles from which it is possible to produce a dispersion which is stable, can be processed readily and by means of which conductive, dielectric or semiconducting layers in semiconductor components which have only a low level of impurities, in particular impurities due to modifiers, can be produced.

BRIEF SUMMARY OF THE INVENTION

The object is achieved according to the invention by surface-modified metal, metal halide, metal chalcogenide, metal nitride, metal phosphide, metal boride or metal phosphate particles or mixtures thereof, wherein the particles have an average particle diameter of from 1 to 500 nm and their surface has been modified by one or more modifiers selected from among the formulae (I) (II) and (III)

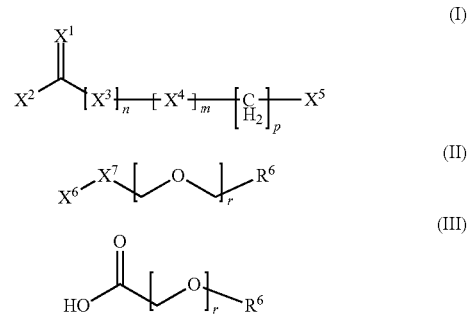

where
$X^1$ is selected from among O, S and Se,
$X^2$ is selected from among OH, $OCH_3$, $OC_2H_5$, $CO_2H$, $OSi(R^1)_{3-x-y}(R^2)_y(R^3)_x$,
x, y are each, independently of one another, 0, 1, 2 or 3 and the sum of x and y is not more than 3,
$R^1$, $R^2$, $R^3$, $R^4$ are selected independently from among H, $C_1$-$C_{10}$-alkyl,
$X^3$ is selected from among O, S, Se and $CH_2$,
n, m, p are each, independently of one another, 0, 1, 2 or 3, preferably 0, 1, 2 and particularly preferably 1,
$X^4$ is selected from among O, S, Se, C=O, —$R^4$C=CH—, $OCH_2$,
$X^5$ is selected from among H, OH, $OCH_3$, $OC_2H_5$, $OSi(R^1)_{(3-x-y)}(R^2)_x(R^3)_y$, $CO_2R^5$, $OCO_2R^6$,
$R^5$ is selected from among $C_1$-$C_4$-alkyl,
$X^6$ is selected from among SH, $NH_2$, $Si(R^1_{3-x-y})(R^2)_y(R^3)_x$,
$X^7$ is selected from among $C_1$-$C_{10}$-alkylene, O, S, Se, Te,
r is an integer from 1 to 1000,
$R^6$ is selected from among H, $C_1$-$C_{10}$-alkyl and halogen.

DETAILED DESCRIPTION OF THE INVENTION

Figure 1:
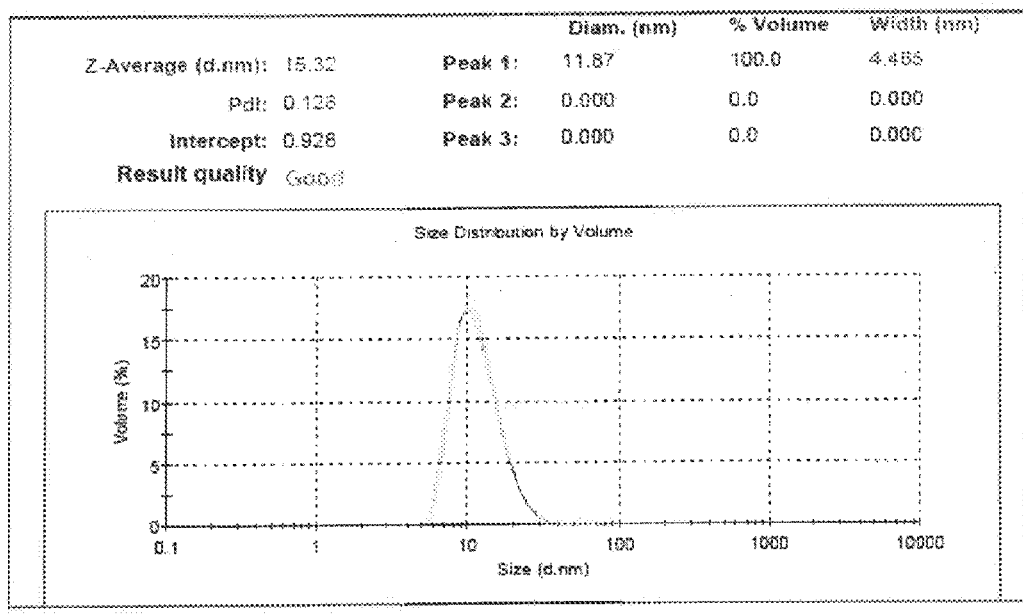
FIG. 1 depicts the particle size distribution of one embodiment of ZnO particles.

The modifiers have a decomposition temperature at which deformation, distortion, decomposition or other thermal changes in the substrate are not observed, in particular when the modified particles are applied to the polymer substrate. This enables the modifiers to be removed from a layer applied to a polymer substrate without adversely affecting the structure of the substrate.

The decomposition temperature of the modifier or modifiers used is preferably below 250° C. The decomposition temperature should also be above 50° C., preferably above 75° C., more preferably above 100° C., in order to avoid premature decomposition. The decomposition temperature is preferably below 200° C., particularly preferably below 150° C. For the purposes of the present patent application, the decomposition temperature is the temperature at which the organic modifier loses its original structure and is decomposed into smaller molecules (e.g. $CO_2$).

The modifiers decompose at low temperatures which even in the coating of polymer substrates do not cause any deformation and form volatile compounds. The thermal decomposition may be described as follows for the example of monoethyl malonate, without the invention being restricted thereto:

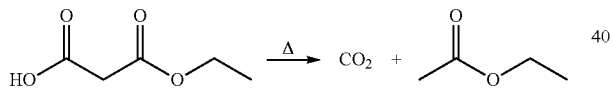

The detection of gaseous $CO_2$ and the volatile ethyl acetate can particularly easily be verified by means of IR, $^1H$ and $^{13}C\{^1H\}$-NMR.

Among the modifiers of the formula (I), preference is given to those in which $X^1$ is O or S, particularly preferably O.

$X^2$ is preferably selected from among OH, $OCH_3$, COOH, $OSi(R^1)_{3-x-y}(R^2)_y(R^3)_x$, particularly preferably from among OH and $OSi(R^1)_{3-x-y}(R^2)_y(R^3)_x$.

Preference is also given to $X^3$ being selected from among O, S, $CH_2$, in particular from among O and $CH_2$. $X^3$ is particularly preferably $CH_2$.

Preference is also given to x and y each being, independently of one another, 0, 1 or 2, particularly preferably 0 or 1.

Preference is also given to $R^1$, $R^2$, $R^3$ and $R^4$ being selected independently from among H and $C_1$-$C_4$-alkyl, particularly preferably H, methyl and ethyl.

Preference is also given to n, m, p each being, independently of one another, 0, 1, 2, particularly preferably 0 or 1. Particular preference is given to at least one of m, n or p being 0.

Preference is also given to $X^4$ being selected from among O, S, C=O, —$R^4$C=CH— and $OCH_2$. Preference is also given to at least one of the groups $X^3$, $X^4$ and $X^5$ comprising C=O.

Preference is also given to $X^5$ being selected from among H, OH, $OSi(R^1)_{(3-x-y)}(R^2)_x(R^3)_y$, $CO_2R^5$, $OCO_2R^5$, particularly preferably from among $CO_2R^5$.

Preference is also given to $R^5$ being selected from among methyl, ethyl and t-butyl, particularly preferably from among ethyl and t-butyl.

For the purposes of the present invention, halogens are F, Cl, Br and I. $X^6$ is preferably selected from among SH, $OSi(R^1_{3-x-y})(R^2)_y(R^3)_x$, particularly preferably $OSi(R^1_{3-x-y})(R^2)_y(R^3)_x$.

Preference is also given to $X^7$ being selected from among $C_1$-$C_4$alkylene, particularly preferably from among —$CH_2$— and —$C_2H_4$—.

Preference is also given to r being an integer from 1 to 100, particularly preferably from 1 to 10.

Preference is also given to $R^6$ being selected from among H and $C_1$-$C_4$-alkyl, particularly preferably from among methyl and ethyl.

Further preferred modifiers are those of the formulae Ia to Ih,

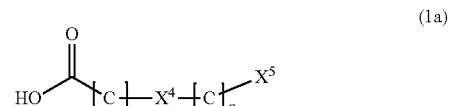

(1a)

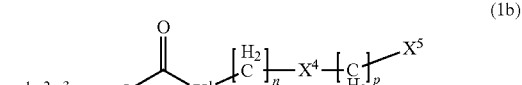

(1b)

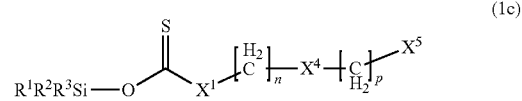

(1c)

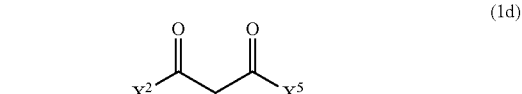

(1d)

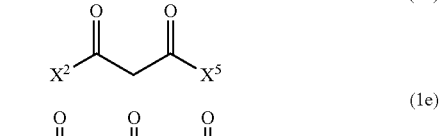

(1e)

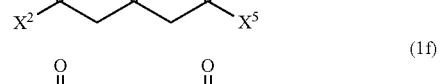

(1f)

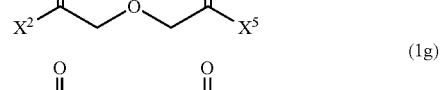

(1g)

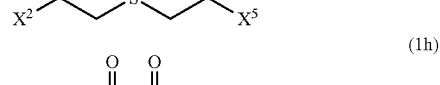

(1h)

where n, p, $X^1$, $X^2$, $X^4$ and $X^5$ are as defined above and $R^1$, $R^2$, $R^3$ are selected from among $C_1$-$C_{10}$-alkyl, particularly preferably methyl, ethyl and t-butyl.

Further preferred embodiments of the modifiers of the formula (I) are those in which n is 0 or n is 1 and $X^3$ is selected from among O, S, Se, C=O, —HC=CH—, $CH_2$, m is 0 or m=1 and $X^4$ is selected from among O, S, C=O and $OCH_2$, p is 0 or 1 and $X^5$ is selected from among $OCH_3$, $OC_2H_5$, $CO_2R^5$ and $OCO_2R^5$.

Particularly preferred modifiers are compounds of the structures IV to IX below:

| Molecule | $X^1$ | $X^2$ | $[X^3]_n$ | $[X^4]_m$ | $[CH_2]_p$ | $X^5$ |
|---|---|---|---|---|---|---|
| 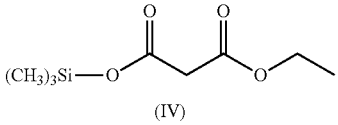<br>(IV) | O | $OSi(CH_3)_3$ | n = 0 | m = 0 | p = 1 | $CO_2Et$ |
| 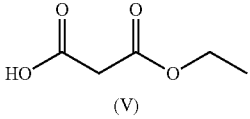<br>(V) | O | OH | n = 0 | m = 0 | p = 1 | $CO_2Et$ |
| 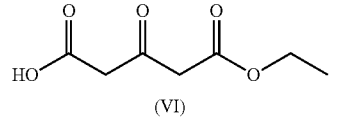<br>(VI) | O | OH | $CH_2$ | C=O | p = 1 | $CO_2Et$ |
| 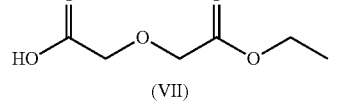<br>(VII) | O | OH | $CH_2$ | O | p = 1 | $CO_2Et$ |
| 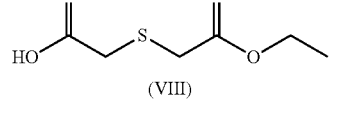<br>(VIII) | O | OH | $CH_2$ | S | p = 1 | $CO_2Et$ |
| 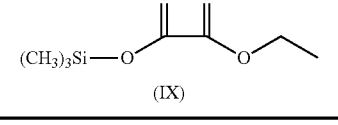<br>(IX) | O | $OSi(CH_3)_3$ | n = 0 | C=O | p = 0 | $CO_2Et$ |

Very particular preference is given to a modifier of the structure (VI).

The particles can be metal, metal chalcogenide, metal phosphide, metal boride, metal nitride or metal phosphate particles or mixtures thereof. The metal chalcogenide, metal phosphide, metal boride, metal phosphate and/or metal nitride particles, in particular metal oxide particles, can be doped or undoped.

Suitable metal halides for the purposes of the present invention are metal fluorides, metal chlorides, metal bromides and metal iodides, preferably fluorides and chlorides. They are particularly preferably metal chlorides.

Suitable metal chalcogenides for the purpose of the present invention are oxides, sulfides, selenides and tellurides, preferably oxides and sulfides. Suitable metal chalcogenide compounds for the deposition of semiconductor layers are the oxides and, for example, CdS, CdSe, CdTe, ZnS, ZnSe, ZnTe, Cu—In—Ga—Se. The metal chalcogenide particles are particularly preferably metal oxide particles.

Preferred metal nitrides are AlN, GaN, InN, Al—Ga—N, In—Ga—N, Al—Ga—In—N. Preferred metal phosphides are GaP, InP, Al—Ga—P, Ga—As—P, Al—Ga—In—P. Preferred metal phosphates are phosphates of the rare earths (lanthanum, cerium, terbium).

The particles, in particular metal oxide particles, can be dielectric, semiconducting or conductive compounds. Examples of binary systems are metal oxides of group 2 (e.g. MgO), group 3 (e.g. $Y_2O_3$), group 4 (e.g. $TiO_2$, $ZrO_2$, $HfO_2$), group 5 (e.g. $V_2O_5$, $Nb_2O_5$, $Ta_2O_5$), group 6 (e.g. $Cr_2O_3$, $MoO_3$, $WO_3$), group 7 (e.g. $MnO_2$), group 8 (e.g. $Fe_2O_3$, $Fe_3O_4$, $RuO_2$), group 9 (e.g. CoO, $Co_3O_4$), group 10 (e.g. NiO), group 11 (e.g. CuO, $Cu_2O$), group 12 (e.g. ZnO, CdO), group 13 ($B_2O_3$, $Al_2O_3$, $Ga_2O_3$, $In_2O_3$) group 14 ($SiO_2$, $GeO_2$, $SnO_2$, PbO, $Pb_3O_4$), group 15 (e.g. $Sb_2O_3$, $Bi_2O_3$, $BiO_3*Bi_2O_5$), of the lanthanides ($La_2O_3$, $CeO_2$). It is of course also possible for such oxides to comprise additional doping elements in order to improve electronic, thermal, magnetic and further properties, (e.g. Sn-, Ge-, Mo-, F-, Ti-, Zr-, Hf-, Nb-, Ta-, W-, Te-doped $In_2O_3$, Sb-, F-, As-, Nb-, Ta-doped $SnO_2$, Al-, Ga-, B-, In-, Y-, Sc-, F-, V-, Si-, Ge-, Ti-, Zr-, Hf-doped ZnO, In-, Sn-doped CdO). Mixtures of metal oxides or ternary systems (e.g. $Zn_2SnO_4$, $ZnSnO_3$, $Zn_2In_2O_5$, $Zn_3In_2O_6$, $In_4Sn_3O_{12}$, $CdIn_2O_4$, $MgIn_2O_4$, $GaInO_3$, $CaTiO_3$, $BaTiO_3$, $MnFe_2O_4$) or quaternary systems (e.g. Zn—In—Sn—O, Zn—In—Li—O, In—Ga—Zn—O) can also be used if required.

Preferred metal oxides for the deposition of semiconducting layers are, for example, ZnO, $Ga_2O_3$, $GeO_2$, CdO, $In_2O_3$, $SnO_2$ and mixtures thereof or reaction products thereof (ternary systems: Zn—Sn—O, Zn—In—O; quaternary systems: Ga—In—Zn—O, Zn—In—Sn—O).

Particularly preferred metal oxides for the deposition of semiconducting layers are ZnO and $In_2O_3$.

In the case of semiconducting compounds, In-, Al-, Ga-, OH-, H-doping or intrinsic defects (O vacancies or Zn intercalations at between-lattice positions) are frequently used to increase the n type mobility. The p type mobility is increased by, for example, doping with Li, N.

Particularly preferred metal oxides for the deposition of semiconducting layers are Al- or Mg-doped ZnO, Ga-doped ZnO, Al-doped MgO, Sn-doped ZnO, Bi-doped ZnO and Sn-doped $In_2O_3$.

Apart from particles of the abovementioned metal compounds, it is also possible to use metallic particles. Suitable metal particles are selected from among Ag, Cu, Au and their alloys with other metals.

The average diameter of the particles used is from 1 to 500 nm, preferably from 2 to 200 nm, more preferably from 5 to 100 nm, particularly preferably from 10 to 50 nm.

The particle size distribution can be unimodal, bimodal or multimodal. The particles can be spherical or have a platelet-like or rod-like morphology. Particular preference is given to the rod-like morphology.

The present invention further provides dispersions comprising
(a) metal, metal chalcogenide, metal halide, metal nitride, metal phosphide, metal boride or metal phosphate particles having a primary average particle diameter of from 1 to 500 nm,
(b) one or more modifiers selected from among compounds having one of the above formulae and
(c) a dispersion medium.

Suitable dispersion media are in principle all fluids in which the particles can be dispersed under the processing conditions. Preference is given to using an organic compound which is liquid at room temperature and atmospheric pressure. Preference is given to using aprotic polar organic liquids. Further preference is given to organic liquids having a boiling point below 200° C., particularly preferably below 100° C. The dipole moment of the dispersion medium is preferably from $3 \cdot 10^{-30}$ C·m to $10 \cdot 10^{-30}$ C·m.

Particular preference is given to using THF, methylene chloride and/or chloroform, very particularly preferably methylene chloride.

In addition to organic liquids as dispersion media, it is possible to use mixtures of these with water.

The modifier serves to stabilize the particles, preferably metal oxide particles, in a nanosize state. Since one application is the production of thin layers from these dispersions (e.g. by spin coating, printing, etc.), it is sensible to use as little modifier as possible since the modifier usually has to be removed again after application of the layers. On the other hand, it is necessary to use sufficient stabilizer to effect lasting stabilization of the dispersions. The molar ratio of modifier to metal oxide can vary in the range from 2:1 to 1:60. Preference is given to a molar ratio of from 1:1 to 1:30, more preferably from 1:5 to 1:25.

The content of particles in the dispersion can be from 0.01 to 30% by weight, preferably from 0.1 to 10% by weight, in particular from 1 to 5% by weight.

For the purposes of the present invention, a substrate can be any conductive, semiconducting or nonconductive substance. The choice of the electrical, mechanical and chemical properties of the substrate depends essentially on the application.

Suitable substrates for the deposition of conductive, semi-conducting or nonconductive layers are generally known to those skilled in the art.

The dispersions of the invention are, owing to their ability to be decomposed at relatively low temperatures, particularly suitable for the application of layers to polymeric substrates, which can once again be conductive, semiconducting or nonconductive.

Particularly suitable polymeric substrates are polyimides (P is, e.g. obtainable under the trade name KAPTON), polyester naphthalate (PEN, e.g. obtainable under the trade name TEONEX Q 51) and polyethylene terephthalate (PET, e.g. obtainable under the trade name Hostaphan).

The modified particles can be produced by
a) suspending untreated metal, metal chalcogenide, metal halide, metal nitride, metal phosphide, metal boride or metal phosphate particles in an aprotic solvent and
b) subsequently admixing this suspension with one or more modifiers of the formula (I) to form the modified particles.

The dispersions obtained in this way can be used directly or can be evaporated to dryness in order to obtain the modified particles. These can be sold directly or subsequently be redispersed in another dispersion medium.

The process will be illustrated below for the example of a preferred production of ZnO dispersions, without the invention being restricted thereto.

Firstly, freshly precipitated ZnO is provided, e.g. by reaction of a Zn salt (e.g. of zinc chloride or $Zn(CH_3COO)_2 \cdot 2H_2O$) with a base (e.g. KOH or NaOH) in a dispersion medium (e.g. in an alcohol such as methanol, ethanol, isopropanol). Doped ZnO particles are obtained, for example, by reaction of a mixture of a Zn salt and the appropriate metal salt (e.g. $AlCl_3$, $Al(OiPr)_3$, Al acetylacetonate in the case of Al doping) with a base in a dispersion medium. Precipitated particles of by-products (e.g. potassium acetate, potassium chloride) can be separated off in a manner known per se, for example by filtration or centrifugation. If necessary, the ZnO dispersion can be concentrated by means of a membrane process such as nanofiltration, ultrafiltration, microfiltration or crossflow filtration before isolation of the precipitated particles. After precipitation and before functionalization, a solvent exchange can also be carried out (e.g. by means of crossflow filtration).

The appropriate modifier is subsequently added in the predetermined ratio so that a transparent dispersion of metal oxide particles is formed. The functionalization is carried out at temperatures ranging from room temperature to the boiling points of the dispersion media used. The pressure is usually from 1 mbar to 50 bar, preferably atmospheric pressure (about 1.013 bar).

The stable dispersion obtained in this way can be applied to the substrate by means of all customary, liquid-based deposition methods. Suitable processes for deposition are, in particular, dip coating or spin coating or a printing process (screen printing, flexo-printing, gravure printing, inkjet printing), without being restricted thereto. The layer thicknesses deposited are usually in the range from 10 nm to 10 preferably from 10 nm to 2 µm, particularly preferably from 20 nm to 200 nm.

To produce the finished layer (conductive, semiconducting, dielectric), the layer is treated thermally at a temperature in the range from about 50° C. to 500° C., preferably from 75° C. to 300° C., more preferably from 100° C. to 200° C. The maximum temperature and treatment time depend on the thermal stability of the substrate, on the decomposition temperature of the modifier and on the required purity of the layer to be deposited.

In the thermal treatment, the modifier is decomposed and removed in the form of volatile substances, i.e. substances which are present in gaseous form in the treatment, from the deposited layer. The decomposition into volatile substances should be substantially complete, but should be at least 60% by weight, preferably 75% by weight, more preferably 85% by weight, particularly preferably 90% by weight. The thermal treatment can be carried out in air, in oxygen, nitrogen, argon, hydrogen, in steam or in mixtures, etc. The duration of the thermal treatment is usually from about 1 minute to about 30 hours, preferably from 30 minutes to 12 hours. Treatment in a plurality of steps using various gases is likewise possible.

As an alternative or in addition, the input of energy to decompose the modifier can be effected by introduction by means of a lamp or a laser having a particular wavelength. The possible wavelength range is from UV to IR (from 150 nm to 2500 nm).

When using a lamp, e.g. an Hg lamp or an excimer lamp, irradiation is carried out either continuously for a time of from 1 second to 24 hours, preferably from 1 minute to 1 hour, and an effective power density of 1 mW/cm$^2$ to 300 kW/cm$^2$ or in pulses with a radiation pulse duration of from 10 ns to 10 seconds and an effective power density of from 0.02 KW/cm$^2$ to 300 kW/cm$^2$.

When using a laser, irradiation is preferably carried out with a radiation pulse duration of from 10 ns to 10 seconds and an effective power density of from 0.02 kW/cm$^2$ to 300 kW/cm$^2$.

A further optional alternative is, in addition to a particular energy input, to treat the layer with the vapor of an acidic, basic or pH-neutral chemical (e.g. $SO_2$, $N_2O$, $N_2H_4$, $NH_3$, $H_2O$) in order to remove the corresponding modification completely from the metal oxide surface.

The decomposition products were examined for the example of monoethyl malonate. Temperatures of max. 200° C. are necessary for decomposition of the preferred molecules (compounds (IV) to (IX)); the decomposition can be carried out under an inert atmosphere (Ar, $N_2$) or in air.

The present invention further provides for the use of the dispersion of the invention for producing conductive layers, dielectric layers and/or semiconducting layers. In the case of conductive layers, a dispersion of electrically conductive particles, in particular metals, is produced and applied to a suitable substrate. In the case of dielectric layers, metal oxide particles are used and in the case of semiconducting layers doped or undoped metal oxide, metal chalcogenide, metal nitride, metal phosphide, metal halide, metal boride or metal phosphate particles are used.

The present invention further provides a process for producing a semiconductor component, e.g. a TFT:

Doped or undoped metal oxide particles are used as semiconductor layer of a TFT. The particles can be processed from a dispersion, e.g. by dip coating, spin coating or printing processes, to form the TFT and (if necessary) baked (annealed). The TFT architectures such as bottom-gate, top-gate, top-contact, bottom-contact, etc., are not subject to any restrictions. Dielectrics can be all possible organic materials, inorganic materials or organic-inorganic hybrid materials. Gate, source and drain contact materials are conductive materials (e.g. Al, Au, Ag, Ti/Au, Cr/Au, ITO, Si, PEDOT/PSS etc.). Suitable substrates also include, in particular, polymeric and flexible materials having a low decomposition temperature and also other thermally labile substrates, without being restricted thereto. Substrate, gate, source and drain contact materials and also dielectrics are not subject to any primary restrictions and can be selected according to the chemical/physical compatibility, the processing process and the desired use. The metal, metal oxide, metal nitride, metal phosphide, metal halide, metal boride or metal phosphate particles and dispersions of the invention are likewise possible for these TFT components.

Finally, the particles and dispersions of the invention can be used for the deposition of transparent conductive layers which can be used in many electronic components and can replace the layers used hitherto. For the purposes of the present patent application, transparent means a transmission of electromagnetic radiation in the range from 400 nm to 800 nm of more than 80%.

EXAMPLES

Example 1

Preparation of ZnO from $Zn(OAc)_2$ 1118 ml of 2-propanol and 36.81 g of $Zn(OAc)_2*2H_2O$ were firstly placed in a 2 l closed stirred apparatus and heated to 75° C. In parallel thereto, 16.38 g of potassium hydroxide in 584 ml of 2-propanol were heated to 75° C. The potassium hydroxide/2-propanol solution was subsequently added to the $Zn(OAc)_2$ suspension. The mixture was heated at 75° C. for one hour while stirring at 425 rpm. After cooling to room temperature, the zinc oxide formed was allowed to settle overnight. The supernatant 2-propanol was filtered off with suction and the zinc oxide was subsequently washed twice with 500 ml each time of THF. The supernatant THF was filtered off with suction.

Example 2

Functionalization of ZnO by Means of Ethyl Trimethylsilyl Malonate

Moist zinc oxide from example 1 was mixed with 1 l of chloroform. 200 g of a ZnO suspension in chloroform having a ZnO content of 1.6 g (19.66 mmol) were admixed with 3.93 mmol of ethyl trimethylsilyl malonate (from Fluke) at room temperature. A few seconds after the addition, the solution became clear. The mixture was stirred at room temperature for a further 15 minutes and the dispersion was subsequently concentrated to bring the ZnO content to 4% by weight.

Figure 2:
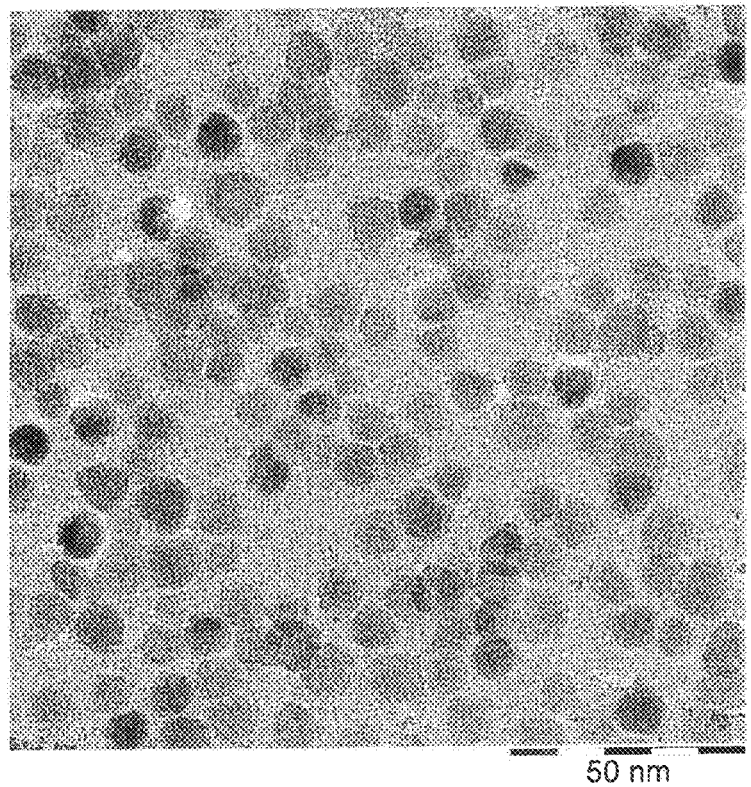
FIG. 2 depicts a TEM analysis of one embodiment of ZnO particles.

ZnO particles having an average diameter of about 10 nm could be detected by determination of the particle size distribution (FIG. 1) and TEM analysis (FIG. 2).

Example 3

Synthesis of monoethyl 3-oxoglutarate (modified method of R. Willstätter, A. Pfannenstiel "Über Succinyldiessigsäureester", Justus Liebigs Annalen der Chemie, 1921, 422, 1-15)

14.45 g (0.099 mol) of 3-oxoglutaric acid (1,3-acetonedicarboxylic acid) were added to 10.2 g (0.10 mol) of acetic anhydride in a 100 ml single-neck flask. The resultant slurry was shaken vigorously until the solid had become homogenized to form a yellow oil. On further shaking, the mixture became warm and a white solid (3-oxoglutaric anhydride) precipitated spontaneously. The mixture was shaken for a further 5 minutes and the flask was allowed to stand at RT for 12 hours. The mixture was subsequently filtered and the solid was washed three times with 5 ml each time of toluene and once with 7 ml of n-hexane. The residue was subsequently stored in a vacuum drying oven for 5 hours.

In the second step, 1.84 g of the anhydride formed were dissolved in 30 ml of abs. ethanol and the solution was immediately evaporated on a rotary evaporator (2.10-3 mbar, RT). This left a light-yellow oil which was stored at −20° C., causing it to solidify.

Example 4

Modification of ZnO by means of monoethyl 3-oxoglutarate (Molar Ratio of ZnO to Modifier=3:1)

Moist zinc oxide from example 1 was mixed with 1 l of methylene chloride. 200 g of a ZnO suspension in methylene chloride having a ZnO content of 1.6 g (19.66 mmol) were admixed with 1.14 g of monoethyl 3-oxoglutarate (6.55 mmol) from example 3 at room temperature; the dispersion immediately became clear. Methylene chloride was subsequently distilled off at 40° C. on a rotary evaporator and the residue was dried under reduced pressure for a further 4 hours.

According to TG analysis of the resulting dry residue (heating rate 3° C./min. to 200° C., 10 min. at 200° C., then 3° C./min. to 400° C.; under argon), 91% of the modifier used had been removed at temperatures below 200° C. The experimentally measured loss in mass was 37.8% by weight; the ratio of modifier/(ZnO+modifier) used was 41.6% by weight.

Figure 3:
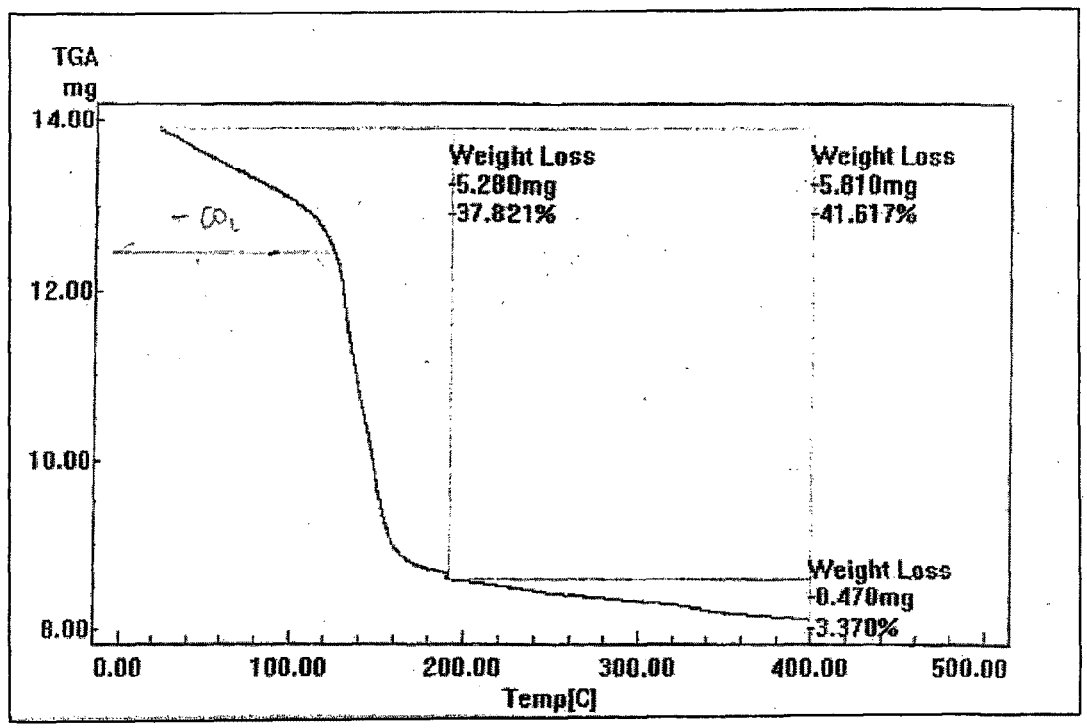
FIG. 3 depicts a TG analysis of one embodiment of modified ZnO particles corresponding to Example 4.

The corresponding TG analysis is shown in FIG. 3.

Example 5

Modification of ZnO by Means of Monoethyl 3-oxoglutarate (Molar Ratio of ZnO to Modifier=5:1)

100 g of a dispersion of zinc oxide (0.80 g of ZnO (9.83 mmol)) in methylene chloride were admixed with 0.34 g (1.97 mmol) of monoethyl 3-oxoglutarate from example 3 by stirring. The dispersion immediately became clear and was subsequently evaporated to dryness. The light-yellow powder formed was subsequently dried under reduced pressure for 4 hours.

According to TG analysis of the corresponding dried powder (heating rate 3° C./min. to 200° C., 10 min. at 200° C., then 3° C./min. to 400° C.; under argon), 88% of the modifier used had been removed at temperatures below 200° C. The experimentally measured loss in mass was 26.6% by weight; the ratio of modifier/(ZnO+modifier) used was 30.1% by weight.

Figure 4:
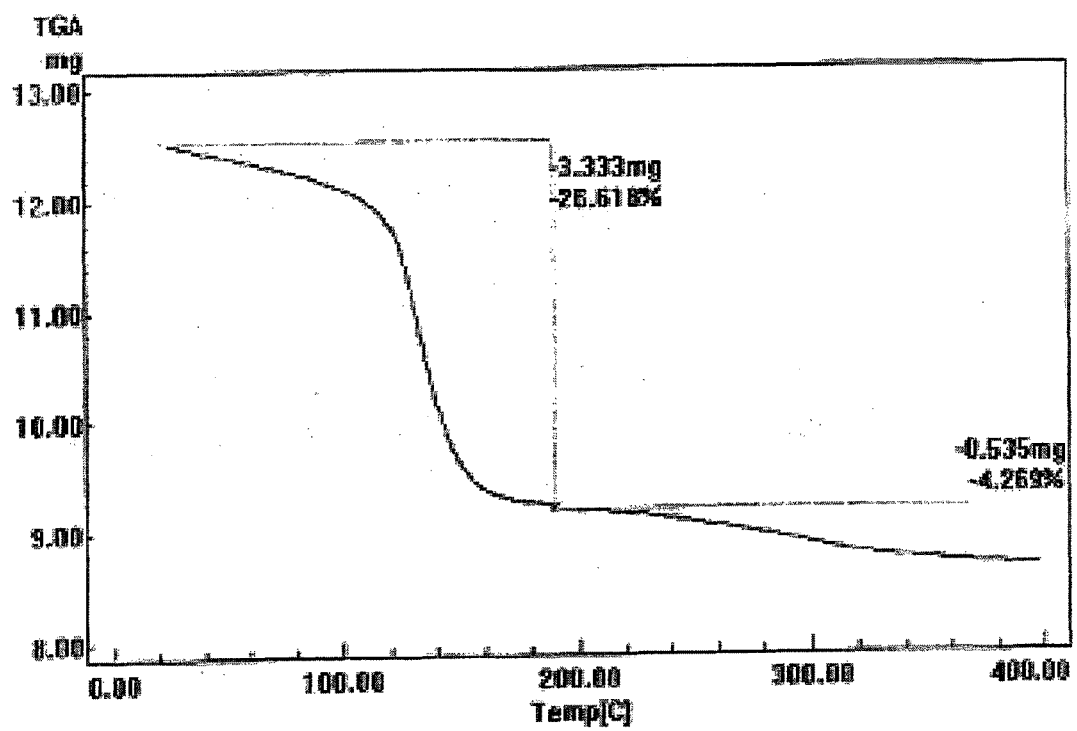
FIG. 4 depicts a TG analysis of one embodiment of modified ZnO particles corresponding to Example 5.

The corresponding TG analysis is shown in FIG. 4.

Example 6

Modification of ZnO by Means of Monoethyl 3-oxoglutarate (Molar Ratio of ZnO to Modifier 29:1)

Moist zinc oxide from example 1 was mixed with 1 l of methylene chloride. 200 g of a ZnO suspension in methylene chloride having a ZnO content of 1.6 g (19.66 mmol) were admixed with 0.12 g of monoethyl 3-oxoglutarate (0.67 mmol) at room temperature; the dispersion immediately became clear. Methylene chloride was subsequently distilled off at 40° C. on a rotary evaporator and the residue was dried under reduced pressure for a further 4 hours.

Comparative Example A

Functionalization of ZnO by means of 2-[2-(2-methoxyethoxy)ethoxy]acetic acid Moist zinc oxide from example 1 was mixed with 1 l of THF. 3.5 g of 2-[2-(2-methoxy-ethoxy)ethoxy]acetic acid (Fluka) were added to this suspension. The mixture formed was heated to boiling while stirring and held at this temperature for 30 minutes. The suspension became clear. THF was subsequently distilled off at 60° C. on a rotary evaporator and the residue was dried under reduced pressure for a further 4 hours.

According to TG analysis of the resulting functionalized ZnO powder (heating rate 5° C./min. to 200° C., 60 min. at 200° C., then 5° C./min. to 500° C.; in air), only 23% of the organic constituent were removed at temperatures below 200° C. The experimentally measured loss in mass in the temperature range room temperature –200° C.=5.8% by weight; total loss from room temperature to 500° C.=25.3% by weight.

Figure 5:
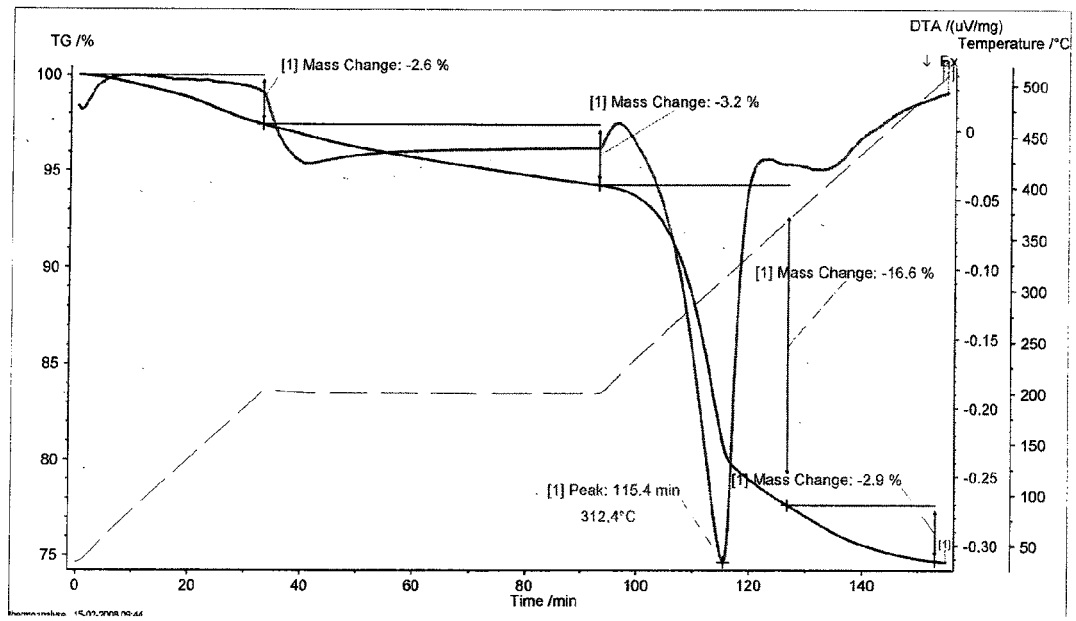
FIG. 5 depicts a TG analysis of functionalized ZnO particles corresponding to Comparative Example A.

The corresponding TG analysis is shown in FIG. 5.

Comparative Example B

Functionalization of ZnO by Means of Ethoxyacetic Acid

Moist zinc oxide from example 1 was mixed with 1 l of THF. 5 g of ethoxyacetic acid (Fluka) were added to this suspension. The mixture formed was heated to boiling while stirring and held at this temperature for 30 minutes. The suspension became clear. THF was subsequently distilled off at 60° C. on a rotary evaporator and the residue was dried under reduced pressure for a further 4 hours.

Figure 6:
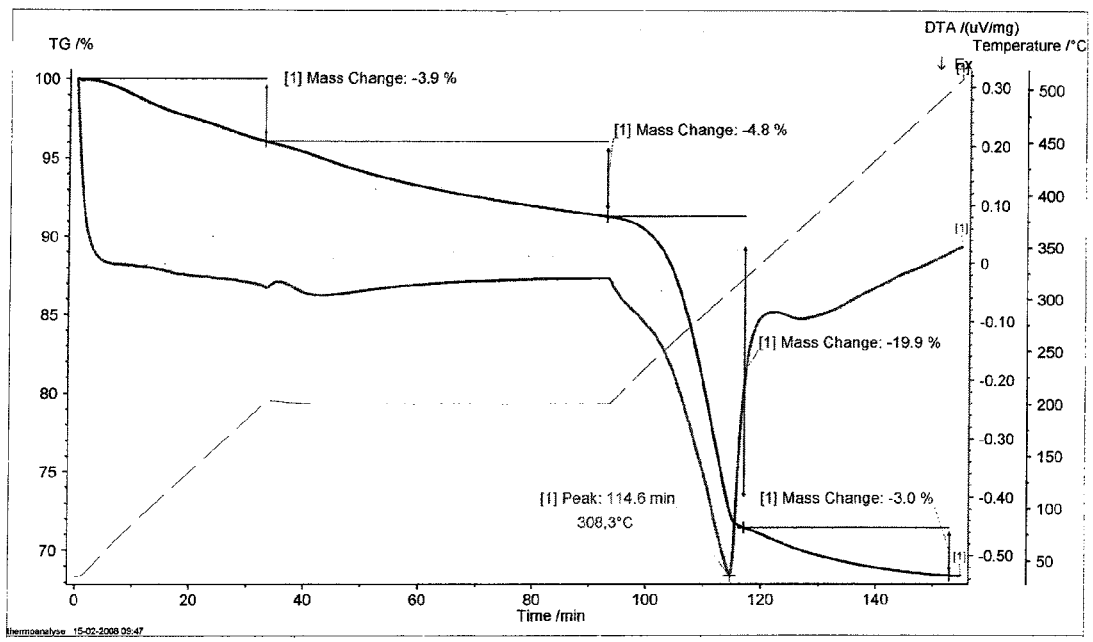
FIG. 6 depicts a TG analysis of functionalized ZnO particles corresponding to Comparative Example B.

According to TG analysis of the resulting functionalized ZnO powder (heating rate 5° C./min. to 200° C., 60 min. at 200° C., then 5° C./min. to 500° C.; in air), only 28% of the organic constituent were removed at temperatures below 200° C. (the experimentally measured loss in mass in the temperature range room temperature –200° C. was 8.7% by weight; the total loss from room temperature to 500° C. was 31.6% by weight). The corresponding TG analysis is shown in FIG. 6.

Example 7

Production of a TFT (Bottom-Gate, Top-Contact Structure)

3 drops of a dispersion in methylene chloride having a content of 4% by weight of ZnO as per example 6 were mixed with 5% by volume of butyl glycol and applied by spin coating (4000 rpm, 30 s) to cleaned Si(doped) substrates having an $SiO_2$ dielectric layer (200 nm). The specimens were subsequently heated to 200° C. and held at 200° C. for 1 hour.

Figure 7:
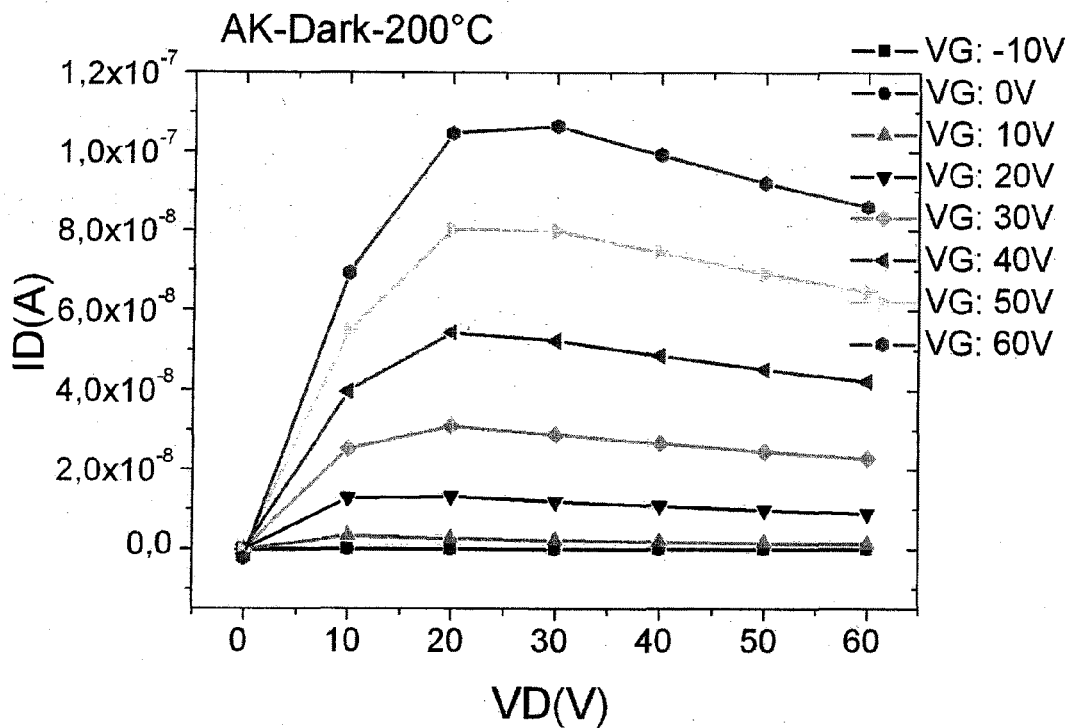
FIG. 7 depicts starting curves (AK) of a TFT transistor corresponding to Example 7.
Figure 8:
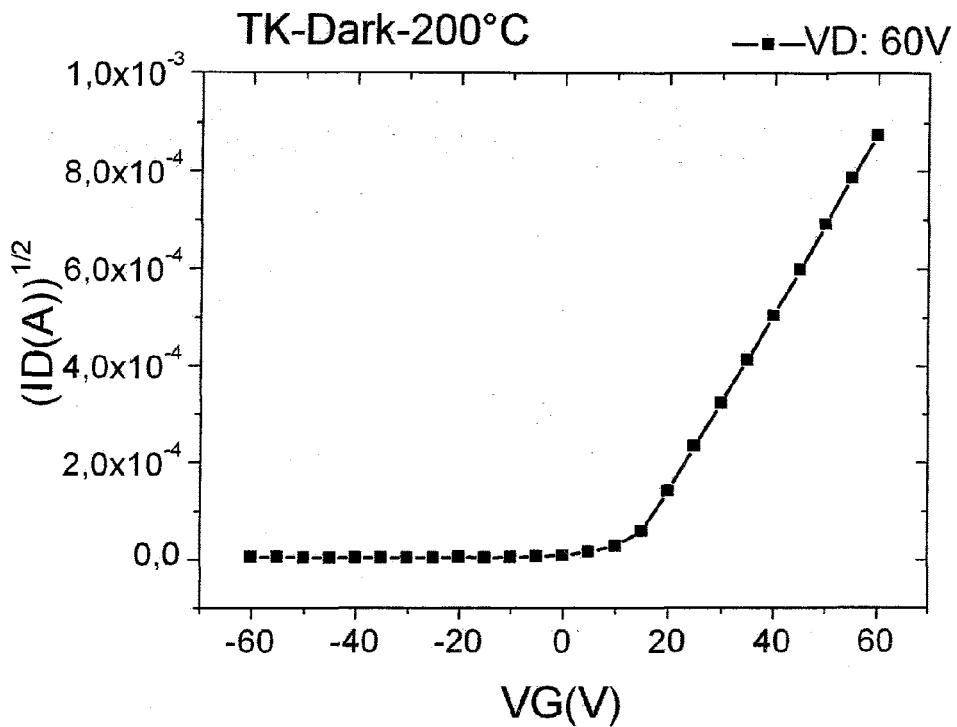
FIG. 8 depicts a transfer curve (TK) of a TFT transistor corresponding to Example 7.

The top-contact source/drain structures were produced by thermal vapor deposition of aluminum. Representative starting curves (AK) and transfer curves (TK) of a corresponding transistor are depicted in FIGS. 7 and 8 (VD: voltage between source and drain, VG: voltage between source and gate, ID: current between source and drain).

The following average parameters were determined: mobility $\mu$: $3*10^{-3}$ cm$^2$/(V*s), on/off ratio: $10^5$, $V_r$ threshold voltage: 12 V.

The invention claimed is:

1. Particles, comprising zinc oxide and having an average particle diameter of from 1 to 500 nm, wherein a surface of the particles has been modified by a modifier of formula (IV):

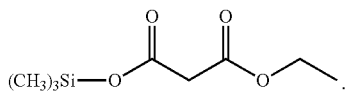
(IV)

2. The particles of claim 1, having an average diameter of from 5 to 100 nm.

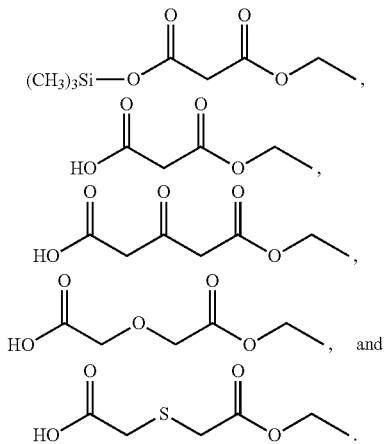

3. The particles of claim 1, wherein a molar ratio of modifier to particles is from 2:1 to 1:60.

4. The particles of claim 1, wherein a decomposition temperature of the modifier is below 250° C.

5. A process for producing the particles of claim 1, the process comprising:
   (a) suspending untreated particles in an aprotic solvent, to give a suspension comprising the untreated particles; and
   (b) subsequently admixing the suspension with the modifier of formula (IV) to form the modified particles.

6. A dispersion, comprising
   (a) particles comprising zinc oxide having an average particle diameter of from 1 to 500 nm,
   (b) a modifier of formula (IV):

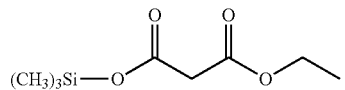
(IV)

and
   (c) a dispersion medium.

7. The dispersion of claim 6, wherein the dispersion medium is at least one organic liquid having a boiling point below 100° C.

8. The dispersion of claim 6, wherein the dispersion medium is at least one organic liquid having a dipole moment of from 3 to $10 \cdot 10^{-30}$ C·m.

9. The dispersion of claim 6, having a content of dispersed particles of from 0.1 to 10% by weight.

10. A process for depositing at least one layer onto a substrate, the process comprising:
    (a) producing a dispersion comprising
        the particles of claim 1, and
        a dispersion medium;
    (b) applying the dispersion to the substrate;
    (c) removing the dispersion medium;
    (d) converting the modifier into volatile substance by thermal treatment at from 100° C. to 500° C. or irradiation with electromagnetic radiation.

11. The process of claim 10, wherein the subsrate is a polymer substrate.

12. A composite comprising the substrate and the at least one layer obtained by the process of claim 10.

13. The composite of claim 12, wherein the at least one layer is conductive and transparent.

14. An electronic component, comprising:
    at least one layer obtained by the process of claim 10; or
    a composite comprising the substrate and the at least one layer.

15. The particles of claim 1, wherein a molar ratio of modifier to particles is from 1:1 to 1:30.

16. The particles of claim 1, wherein a molar ratio of modifier to particles is from 1:5 to 1:25.

17. The particles of claim 1, wherein a decomposition temperature of the modifier is below 200° C.

* * * * *